US012649651B2

(12) United States Patent
Rhee et al.

(10) Patent No.: US 12,649,651 B2
(45) Date of Patent: Jun. 9, 2026

(54) MICRO ELECTRO-MECHANICAL SYSTEM SENSOR

(71) Applicant: SAMSUNG ELECTRONICS CO., LTD., Suwon-si (KR)

(72) Inventors: Choongho Rhee, Anyang-si (KR); Sungchan Kang, Hwaseong-si (KR); Cheheung Kim, Yongin-si (KR); Yongseop Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 874 days.

(21) Appl. No.: 17/941,380

(22) Filed: Sep. 9, 2022

(65) Prior Publication Data

US 2023/0212001 A1     Jul. 6, 2023

(30) Foreign Application Priority Data

Dec. 30, 2021  (KR) ........................ 10-2021-0193435
Apr. 5, 2022  (KR) ........................ 10-2022-0042525

(51) Int. Cl.
B81B 3/00         (2006.01)
(52) U.S. Cl.
CPC .... B81B 3/0021 (2013.01); *B81B 2201/0271* (2013.01); *B81B 2203/0118* (2013.01); *B81B 2203/0315* (2013.01); *B81B 2207/03* (2013.01); *B81B 2207/05* (2013.01)
(58) Field of Classification Search
CPC .................................................. B81B 3/0021
USPC ...................................................... 73/24.03
See application file for complete search history.

(56) References Cited

U.S. PATENT DOCUMENTS

| | | | |
|---|---|---|---|
| 5,291,781 A | 3/1994 | Nagata et al. |
| 5,856,722 A | 1/1999 | Haronian et al. |
| 8,103,027 B2 | 1/2012 | Zhang et al. |
| 8,170,244 B2 | 5/2012 | Ryan et al. |
| 8,816,283 B2 | 8/2014 | Yon et al. |
| 9,148,729 B2 | 9/2015 | Josefsson |
| 9,479,884 B2 | 10/2016 | Kim |
| 10,141,007 B1 | 11/2018 | Kim et al. |
| 10,447,238 B2 | 10/2019 | Kang et al. |

(Continued)

FOREIGN PATENT DOCUMENTS

| | | |
|---|---|---|
| EP | 2514712 A2 | 10/2012 |
| JP | 2013542437 A | 11/2013 |

(Continued)

OTHER PUBLICATIONS

Communication dated May 2, 2023, issued by the European Patent Office in counterpart European Application No. 22194650.2.

*Primary Examiner* — Walter L Lindsay, Jr.
*Assistant Examiner* — Philip T Fadul
(74) *Attorney, Agent, or Firm* — Sughrue Mion, PLLC

(57) ABSTRACT

Provided is a micro electro-mechanical system (MEMS) sensor including a substrate including a first cavity, a first frame including a second cavity at least partially overlapping the first cavity, at least a portion of the first frame being spaced apart from the substrate, a plurality of resonators, each of the plurality of resonators including a first end connected to the first frame and a second end extending into the second cavity, and a second frame including a first region connected to the first frame and a second region spaced apart from the first frame and connected to the substrate.

22 Claims, 17 Drawing Sheets

(56)　　　　　　References Cited

U.S. PATENT DOCUMENTS

| | | | |
|---|---|---|---|
| 10,528,069 | B2 | 1/2020 | Hong et al. |
| 10,566,011 | B2 | 2/2020 | Park et al. |
| 10,742,190 | B2 | 8/2020 | Yoon et al. |
| 10,756,746 | B2 | 8/2020 | Hong et al. |
| 10,823,814 | B2 | 11/2020 | Kang et al. |
| 11,039,262 | B2 | 6/2021 | Kim et al. |
| 11,341,973 | B2 | 5/2022 | Kim et al. |
| 11,476,832 | B2 * | 10/2022 | Park ..................... H03H 9/0523 |
| 2016/0090297 | A1 | 3/2016 | Zhang et al. |
| 2018/0309941 | A1 | 10/2018 | Lopez et al. |
| 2020/0212885 | A1 | 7/2020 | Kim et al. |
| 2021/0184646 | A1 * | 6/2021 | Mori ................. H03H 9/02393 |
| 2021/0199527 | A1 | 7/2021 | Alfaro |

FOREIGN PATENT DOCUMENTS

| | | | |
|---|---|---|---|
| JP | 2019203858 | A | 11/2019 |
| WO | 2012/103903 | A1 | 8/2012 |
| WO | 2021/209682 | A2 | 10/2021 |

* cited by examiner

MICRO ELECTRO-MECHANICAL SYSTEM SENSOR

CROSS-REFERENCE TO RELATED APPLICATIONS

This application claims priority to Korean Patent Application No. 10-2021-0193435, filed on Dec. 30, 2021, and Korean Patent Application No. 10-2022-0042525, filed on Apr. 5, 2022 in the Korean Intellectual Property Office, the disclosures of which are incorporated by reference herein in their entireties.

BACKGROUND

1. Field

Example embodiments of the present disclosure relate to micro electro-mechanical system (MEMS) sensors and electronic apparatuses including the MEMS sensors.

2. Description of Related Art

A MEMS sensor has a cantilever beam structure with one fixed side and another side that vibrates. The MEMS sensor may analyze acoustic characteristics or vibration characteristics through vibration of the cantilever beam structure. The MEMS sensor may be used for analysis of sound or voice information in mobile electronic devices, automobiles, and the like. In addition, the MEMS sensor may be attached to the human skin to measure biometric information, such as the heart rate, or may be mounted on a vehicle or home appliance to measure vibration information. In addition, the MEMS sensor may be used as an energy harvesting device that generates energy using sound or vibration.

SUMMARY

One or more example embodiments provide micro electro-mechanical system (MEMS) sensors that may have reduced defects in a resonator provided therein.

However, the problem to be solved is not limited to the above disclosure.

Additional aspects will be set forth in part in the description which follows and, in part, will be apparent from the description, or may be learned by practice of example embodiments of the disclosure.

According to an aspect of an example embodiment, there is provided a micro electro-mechanical system (MEMS) sensor including a substrate including a first cavity, a first frame including a second cavity at least partially overlapping the first cavity, at least a portion of the first frame being spaced apart from the substrate, a plurality of resonators, each of the plurality of resonators including a first end connected to the first frame and a second end extending into the second cavity, and a second frame including a first region connected to the first frame and a second region spaced apart from the first frame and connected to the substrate.

The second frame may be provided adjacent to an outer circumferential surface of the first frame.

The first frame and the second frame may have a monolithic structure.

The first frame and the second frame may include silicon.

A length of the first region may be less than a length of the second region.

A width of the first region may be greater than or equal to a width of the second region.

The width of the first region may be equal to a sum of the width of the first region and a gap between the second region and the first frame.

A gap between the second region of the second frame and the first frame may be constant.

Based on the second frame having a rectangular shape, a gap between the second region of the second frame and the first frame may be greater than or equal to a value d1 and less than or equal to than 4 times of the value d1, where d1 satisfies:

$$d1 = \frac{L_2^2 * L_1^2}{6 * E_{peri} * (L_2^2 * I_{1,x} + L_1^2 * I_{2,x})} S + \frac{L_2^3 * L_1^3}{12 * E_{peri} * (L_2^3 * I_{1,x} + L_1^3 * I_{2,x})} F$$

$$I_{i,x} = \frac{w_i^3 t_{peri}}{12}, i = 1, 2$$

where, F is a force applied to the second frame in a first direction, S is shear stress of the second frame, $L_i$ (where i=1 or 2) is a length of the first direction side of the second frame, $I_i$, x (where i=1 or 2) is a moment of inertia of the second frame, $E_{peri}$ is a strength of the second frame, and $W_i$ (where i=1 or 2) is a width of the second frame.

A partial region of the second frame may be connected to the substrate.

The second region of the second frame may be connected to the substrate.

The first region of the second frame may be a partial region of the first frame.

A ratio of a length of the second frame to a width of the second frame may be greater than or equal to 8 and less than or equal to 200.

A ratio of a length of the second frame to a thickness of the second frame may be 1.2 to 15.

A thickness of the second frame may be greater than a thickness of the first frame.

A shape of the outer circumferential surface of the second frame may be one of a polygon, a circle, and an oval.

A shape of an inner circumferential surface of the second frame may be different from the shape of the outer circumferential surface of the second frame.

The substrate may include a printed circuit board configured to receive electrical signals from the plurality of resonators.

The MEMS sensor may further include a cover configured to protect the plurality of resonators from the outside.

An end of the cover may be connected to the substrate.

The MEMS sensor may further include a spacer that includes a first end in contact with the cover and a second end in contact with the second frame, wherein the cover is connected to the second frame through the spacer.

The plurality of resonators may include a first group of resonators fixed to a first side of the first frame, and a second group of resonators fixed to a second side of the first frame opposite to the first side.

According to another aspect of an example embodiment, there is provided a micro electro-mechanical system (MEMS) sensor including a substrate including a first cavity, a first frame including a second cavity at least partially overlapping the first cavity, at least a portion of the first frame being spaced apart from the substrate, a plurality of resonators, each of the plurality of resonators including a first end connected to the first frame and a second end extending into the second cavity, and a second frame provided adjacent to the first frame, the second frame including a first region connected to the first frame and partially spaced apart from the substrate, and a second region spaced apart from the first frame and connected to the substrate.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
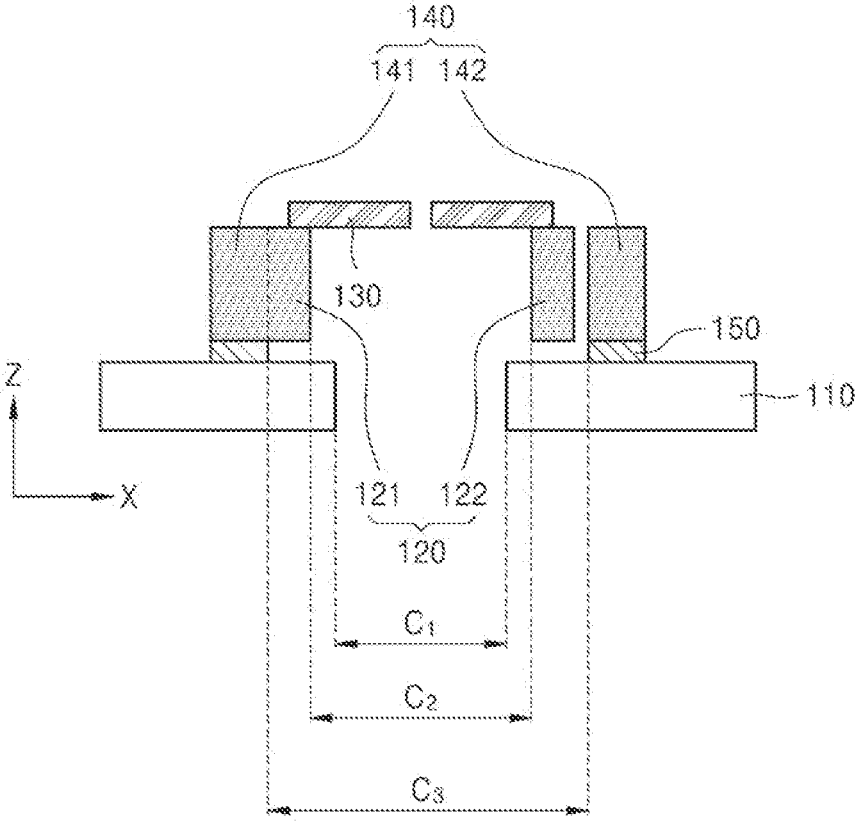
FIG. 1 is a cross-sectional view illustrating a micro electro-mechanical systems (MEMS) sensor according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, spatial light modulators and electronic apparatuses including the same according to various embodiments will be described in detail with reference to the accompanying drawings. In the drawings, like reference numerals refer to like elements, and the size of each component may be exaggerated for clarity and convenience of explanation. It will be understood that, although the terms "first", "second", etc. may be used herein to describe various elements, these elements should not be limited by these terms. These terms are only used to distinguish one element from another.

In the following descriptions, the singular forms include the plural forms unless the context clearly indicates otherwise. When a part "comprises" or "includes" an element in the specification, unless otherwise defined, it is not excluding other elements but may further include other elements.

Sizes or thicknesses of constituent elements in the drawings may be exaggerated for clarity of explanation. Also, when a predetermined material layer is present on a substrate or another layer, the material layer may be present in direct contact with the substrate or other layer, and there may be a third layer therebetween. Also, in the following embodiments, a material included in each layer is example, that is, other materials may be included.

Also, in the specification, the term "units" or " . . . modules" denote units or modules that process at least one function or operation, and may be realized by hardware, software, or a combination of hardware and software.

Specific executions described in the present disclosure are example embodiments and do not limit the technical scope of the present invention even in any method. For conciseness of the specification, descriptions of conventional electronic configurations, control systems, software, and other functional aspects of the systems may be omitted. Also, the connections of lines and connection members between constituent elements depicted in the drawings are examples of functional connection and/or physical or circuitry connections, and thus, in practical devices, may be expressed as replicable or additional functional connections, physical connections, or circuitry connections.

The term "above" and similar directional terms may be applied to both singular and plural.

The use of any and all examples, or exemplary language (e.g., "such as") provided herein, is intended merely to better illuminate the inventive concept and does not pose a limitation on the scope of the inventive concept unless otherwise claimed.

Figure 2:
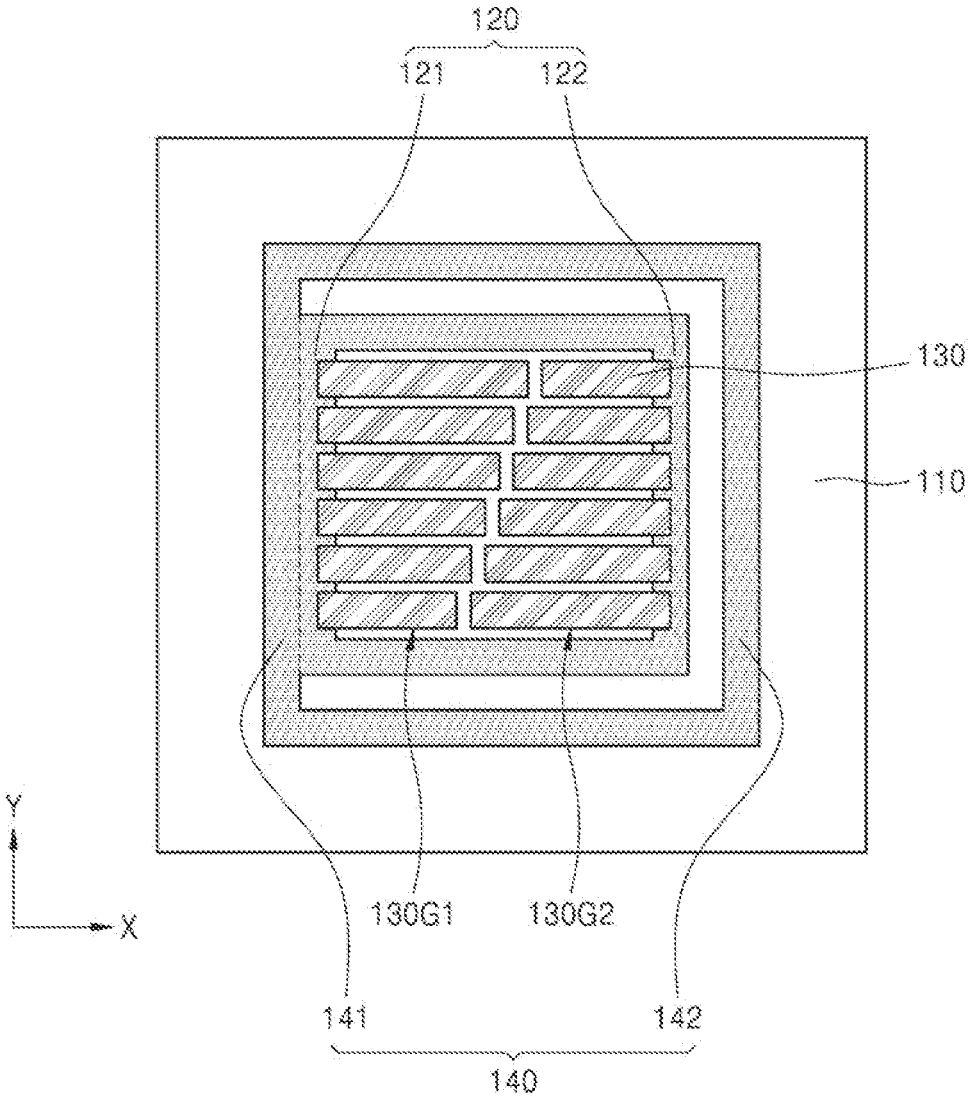
FIG. 2 is a plan view of the MEMS sensor of FIG. 1.
Figure 3:
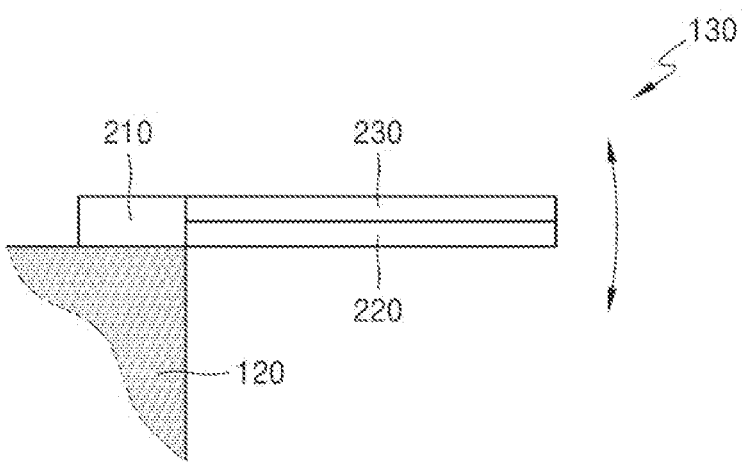
FIG. 3 is a diagram illustrating an example of a resonator included in the MEMS sensor of FIG. 1.

FIG. 1 is a cross-sectional view illustrating a micro electro-mechanical systems (MEMS) sensor according to an example embodiment, FIG. 2 is a plan view of the MEMS sensor of FIG. 1, and FIG. 3 is a diagram illustrating an example of a resonator 130 included in the MEMS sensor of FIG. 1.

Referring to FIGS. 1 and 2, the MEMS sensor may include a substrate 110 having a first cavity C1, a first frame 120 including a second cavity C2 that at least partially overlaps the first cavity C1, a plurality of resonators 130 having one end in contact with the first frame 120 and the other end extending into the second cavity C2, a second frame 140 having a region connected to the first frame 120, and another region spatially separated from the first frame 120.

The substrate 110 may include a silicon substrate or a glass substrate. As another example, the substrate 110 may be a printed circuit board including silicon (Si), polyethylene terephthalate (PET), glass, polycarbonate (PC), or silicon (Si).

When the substrate 110 is a printed circuit board, the substrate 110 may include an insulating layer and a plurality of circuit patterns printed on the insulating layer. The circuit pattern may electrically connect the resonator 130 and a processor that processes an electrical signal received from the resonator 130. The type of the substrate 110 is not limited to the embodiment described above, and various types of substrates commonly used in the art may be substituted or the substrate 110.

The first cavity C1 is formed through the substrate 110. An external force, for example, acoustic energy or vibration energy, may be introduced through the first cavity C1.

The first frame 120 including the second cavity C2 may be disposed on the substrate 110. At least a portion of the second cavity C2 may overlap the first cavity C1 in a thickness direction (z-axis direction) of the substrate 110. In the drawing, it is illustrated that a portion of the second cavity C2 overlaps the first cavity C1 in the thickness direction of the substrate 110. However, embodiments are not limited thereto. The entire second cavity C2 may overlap the first cavity C1 in the thickness direction of the substrate 110.

A plurality of resonators 130 may be arranged on the first frame 120. The plurality of resonators 130 may be arranged one-dimensionally or two-dimensionally without overlapping each other. One end of each of the plurality of resonators 130 may be fixed to the first frame 120, and the other end may be provided to extend toward the second cavity C2.

Referring to FIG. 3, at least one of the plurality of resonators 130 may include a fixed part 210 fixed to the first frame 120, a movable part 220 configured to move in response to an input signal, and a sensor 230 configured to sense a movement of the movable part 220. The sensor 230 may generate an electrical signal by sensing the movement of the movable part 220 by using a piezoelectric method or a capacitance method.

The plurality of resonators 130 may be provided to sense frequencies of different bands of external force. For example, the plurality of resonators 130 may be provided to have different center frequencies. To this end, the plurality of resonators 130 may be provided to have different dimensions. For example, the plurality of resonators 130 may be provided to have different lengths, widths, or thicknesses.

For example, as shown in FIG. 2, the plurality of resonators 130 may include a first group of resonators 130G1 fixed to a first side of the first frame 120 and a second group of resonators 130G2 fixed to a second side facing the first side of the first frame 120. The first group of resonators 130G1 and the second group of resonators 130G2 are disposed to face each other in the second cavity C2 so that many resonators 130 may be arranged in the second cavity C2 having a small space.

Each of the plurality of resonators 130 may generate an electrical signal corresponding to a sensed frequency, and the electrical signal may be transmitted to a processor through a wiring and a circuit pattern disposed on the substrate 110.

The second frame 140 may further be disposed on the substrate 110. The second frame 140 may include a first region 141 connected to the first frame 120 and a second region 142 separated from the first frame 120. For example, the first region 141 of the second frame 140 is connected to a first region 121 of the first frame 120, and the second region 142 of the second frame 140 is separated and spaced apart from a second region 122 of the first frame 120.

The second frame 140 may be provided adjacent to and surround an outer circumferential surface of the first frame 120. In addition, at least a region of the second frame 140 may be adhered to the substrate 110 through an adhesive layer 150. Thus, the first frame 120 may be connected to the substrate 110 through the second frame 140.

The second frame 140 may include a third cavity C3 overlapping the second cavity C2. The second frame 140 may have a shape in which a length in the x-axis direction is greater than a width in the y-axis direction. For example, a ratio of the length of the second frame 140 to the width of the second frame 140 is about 3 or more, about 5 or more, about 8 or more, about 10 or more, about 20 or more, about 50 or more, about 100 or more, about 150 or less, about 200 or less, or about 300 or less. The second frame 140 may have a shape in which a length is greater than a thickness. For example, a ratio of the length of the second frame 140 to the thickness of the second frame 140 may be about 1 or more, about 1.2 or more, about 3 or more, about 5 or more, about 10 or more, about 15 or less, or about 20 or less.

As shown in FIG. 2, a shape of the outer circumferential surface of the second frame 140 and a shape of the inner circumferential surface of the second frame 140 are the same, and thus, the width of the second frame 140 may be constant. However, embodiments are not limited thereto. The shape of the outer circumferential surface of the second frame 140 and the shape of the inner circumferential surface of the second frame 140 may be different.

The first frame 120 and the second frame 140 may have a monolithic structure. For example, in connecting the first frame 120 and the second frame 140, they may be connected in direct contact without a seam, for example, an adhesive. The first frame 120 and the second frame 140 may be manufactured by using an etching process of a single wafer, for example, a silicon wafer. Thus, the first frame 120 and the second frame 140 may include the same material.

The first frame 120 may fix the plurality of resonators 130, while the second frame 140 may fix the first frame 120 to the substrate 110. In addition, the second frame 140 may prevent the first frame 120 from being deformed.

When the first frame 120 is directly attached to the substrate 110 without the second frame 140, non-uniform deformation may occur to the first frame 120 in a process of adhering the first frame 120 to the substrate 110. For example, a non-uniform thickness of the adhesive layer 150 or deformation may occur in the first frame 120 while the adhesive layer 150 is cured. According to another embodiment, after the first frame 120 is adhered to the substrate 110, deformation may occur in the first frame 120 by an external force.

Because the first frame 120 fixes the plurality of resonators 130, deformation of the first frame 120 may cause defects, such as deformation or damage of the plurality of resonators 130, and an electrical short may occur between the plurality of resonators 130.

The first frame 120 according to an example embodiment may be connected to the substrate 110 through the second frame 140 without being directly attached to the substrate 110. Thus, deformation occurring in a process of fixing the first frame 120 to the substrate 110 may be prevented.

In addition, because the second region 142 of the second frame 140 is spatially separated from the first frame 120 while enclosing the first frame 120, even if the second frame 140 is deformed by an external force, deformation of the first frame 120 may be reduced.

The thickness of the second frame 140 may be greater than or equal to the thickness of the first frame 120. Thus, even if the first frame 120 vibrates due to the vibration of the resonators 130 in the thickness direction of the first frame 120, the second frame 140 may more stably support the first frame 120.

A size of the first region 141 of the second frame 140 may be less than or equal to a size of the second region 142 of the second frame 140. For example, a length of the first region 141 may be less than or equal to a length of the second region 142. Thus, the second frame 140 may more effectively prevent deformation of the first frame 120.

A width of the first region 141 may be greater than or equal to a width of the second region 142. In FIG. 2, it is illustrated that the width of the first region 141 is equal to the width of the second region 142. However, embodiments are not limited thereto. The width of the first region 141 may be greater than the width of the second region 142.

A gap between the first frame 120 and the second frame 140 may be determined in consideration of an external force applied to the MEMS sensor, a dimension of the second frame 140, and a modulus of the second frame 140.

A gap between the first frame 120 and the second region 142 of the second frame 140 may be constant. When the lengths of opposite sides of the second frame 140 are not equal to each other, a minimum gap between the first frame 120 and the second region 142 of the second frame 140 may vary.

Figure 4:
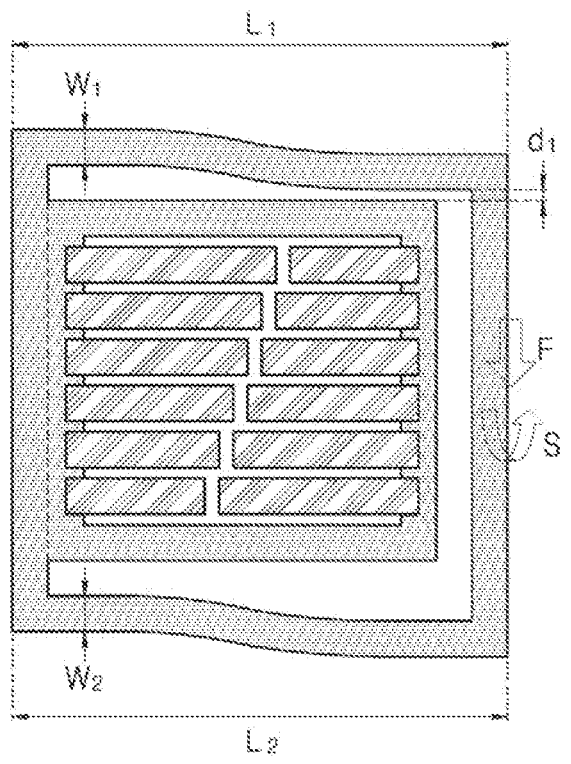
FIG. 4 is a diagram illustrating a state in which an external force is applied in a Y-axis direction to a MEMS sensor having opposite sides of the same length, according to an example embodiment.
Figure 4:
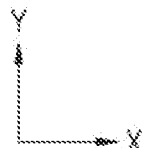

FIG. 4 is a diagram schematically illustrating a state in which an external force is applied in a Y-axis direction to a MEMS sensor having the same length of opposite sides, according to an example embodiment. As shown in FIG. 4, when an external force is applied to the second frame 140 in the Y-axis direction, the second frame 140 may move by a value d1 as shown in Equation 1 below.

$$d1 = \frac{L_2^2 * L_1^2}{6 * E_{peri} * (L_2^2 * I_{1,x} + L_1^2 * I_{2,x})} S +$$
$$\frac{L_2^3 * L_1^3}{12 * E_{peri} * (L_2^3 * I_{1,x} + L_1^3 * I_{2,x})} F$$

[Equation 1]

-continued
$$I_{i,x} = \frac{w_i^3 t_{peri}}{12}, i = 1, 2$$

Here, F is a force applied in the Y-axis direction, S is shear stress of the second frame 140, $L_i$ (here, i=1 or 2) is a length of an x-axis side of the second frame 140, Ii, x (here i=1 or 2) is the moment of inertia of the second frame 140, $E_{peri}$ is the strength of the second frame 140, and Wi (here, i=1 or 2) is a width of the second frame 140.

Accordingly, even if the second frame 140 is deformed by an external force, in order for the second frame 140 not to affect the first frame 120, the gap between the first frame 120 and the right side of the second frame 140 may be designed to be greater than or equal to the value d1 of Equation 1. If the gap between the first frame 120 and the second region 142 of the second frame 140 is relatively large, the size of the MEMS sensor may increase. In order to maintain a compact MEMS sensor, the gap between the first frame 120 and the second region 142 of the second frame 140 may be designed to be not more than 4 times of the value d1 of Equation 1.

Figure 5:
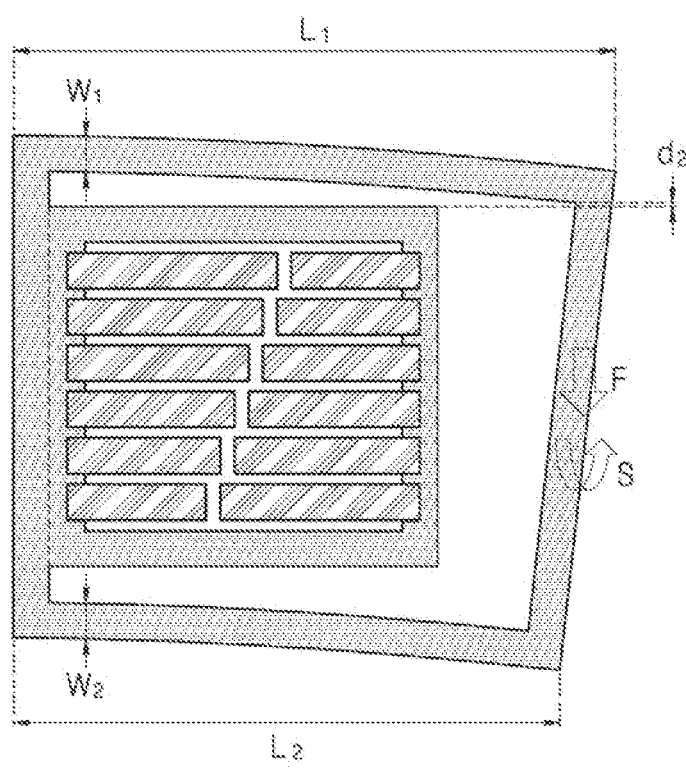
FIG. 5 is a diagram illustrating a state in which an external force is applied in a Y-axis direction to a MEMS sensor having opposite sides of different lengths, according to an example embodiment.
Figure 5:
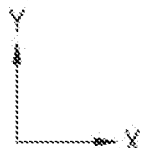

FIG. 5 is a diagram illustrating a state in which an external force is applied in the Y-axis direction to MEMS sensors having different lengths of opposite sides, according to an embodiment. As shown in FIG. 5, when an external force is applied in the Y-axis direction, the second frame 140 may move by a value d2 as shown in Equation 2 below. Here, it is assumed that the external force F is applied from the long side L1 to the short side L2.

$$d2 = \frac{L_2^2 * L_1^2}{6 * E_{peri} * (L_2^2 * I_{1,x} + L_1^2 * I_{2,x})} S +$$
$$\frac{L_2^3 * L_1^3}{3 * E_{peri} * (L_2^3 * I_{1,x} + L_1^3 * I_{2,x})} F$$
$$I_{i,x} = \frac{w_i^3 t_{peri}}{12}, i = 1, 2$$

[Equation 2]

Here, F is a force applied in the Y-axis direction, S is shear stress of the second frame 140, $L_i$ (here, i=1 or 2) is a length of the x-axis side of the second frame 140, Ii, x (here i=1 or 2) is the moment of inertia of the second frame 140, $E_{peri}$ is strength of the second frame 140, and $W_i$ (here, i=1 or 2) is a width of the second frame 140.

Therefore, even if the second frame 140 is deformed by an external force, in order for the second frame 140 to not affect the first frame 120, the gap between the second frame of the first frame 120 and the region 142 of the second frame 140 may be designed to be greater than or equal to the value d2 of Equation 2. In order to implement a compact MEMS sensor, the gap between the first frame 120 and the second region 142 of the second frame 140 may be designed to be not more than three times the value d2 of Equation 2

It has been described that the external force is applied in the Y-axis direction. However, embodiments are not limited thereto. The external force may be applied in the X-axis direction, the biaxial direction, or the triaxial direction. Since the moment of inertia of the second frame 140 increases when an external force is applied in the Y-axis direction, the X-axis direction, the 2-axis direction, or the 3-axis direction, the moving distance of the second frame 140 is the value d1 of Equation 1 and the value d2 of Equation 2 may be smaller than the value d2. Accordingly, if the gap between the first frame 120 and the second region 142 of the second frame 140 according to an example embodiment is equal to or greater than the value d1 of Equation 1 and the value d2 of Equation 2, deformation of the second frame 140 by the external force may not affect the first frame 120.

Figure 6:
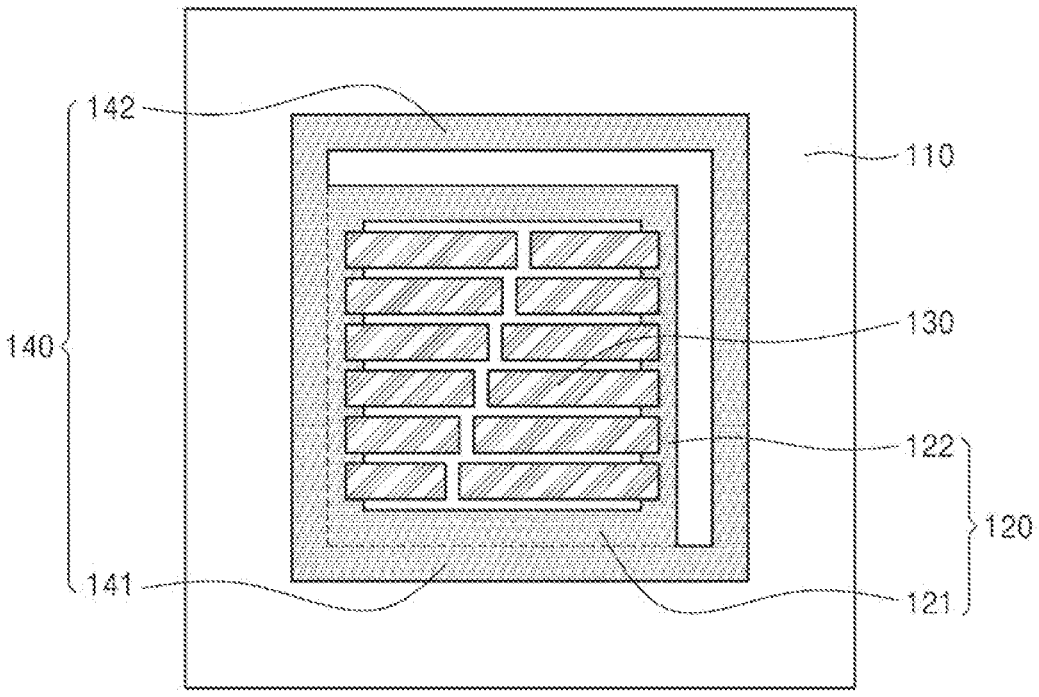
FIG. 6 is a diagram illustrating a MEMS sensor in which two sides of a first frame and a second frame according to an embodiment are connected to each other.

FIG. 6 is a diagram illustrating a MEMS sensor in which two sides of each of the first frame 120 and the second frame 140 are connected to each other, according to an example embodiment. Comparing FIGS. 1 and 6, two sides of the first frame 120 illustrated in FIG. 6 may be connected to two sides of the second frame 140. In addition, the remaining two sides of the first frame 120 are spatially separated from the corresponding sides of the second frame 140. Because the two sides of the first frame 120 are connected to the two sides of the second frame 140, the first frame 120 may be more stably disposed on the substrate 110.

Figure 7:
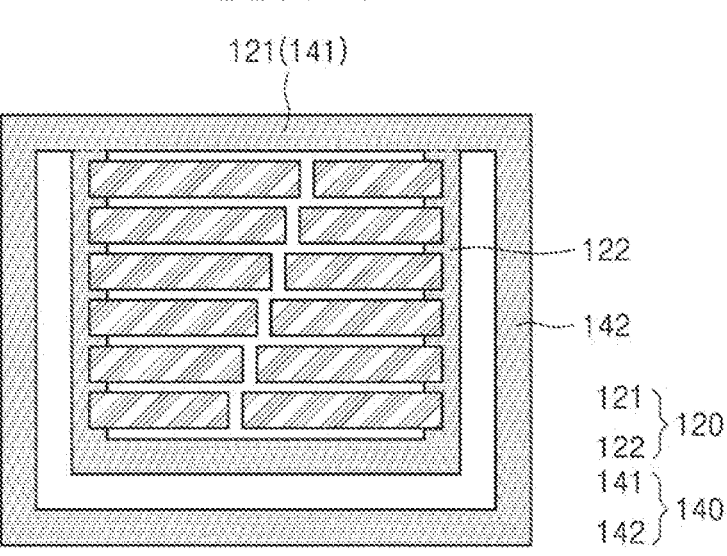
FIG. 7 is a diagram illustrating a MEMS sensor in which a first frame and a second frame according to an example embodiment share a partial region.

FIG. 7 is a diagram illustrating a MEMS sensor in which the first frame 120 and the second frame 140 according to an example embodiment share a partial region. Comparing FIGS. 1 and 7, the first frame 120 and the second frame 140 of FIG. 7 may share a partial region. For example, the first region 121 of the first frame 120 may be the first region 141 of the second frame 140. Because the first region 141 of the second frame 140 is adhered to the substrate 110, the first frame 120 may be more stably disposed on the substrate.

Figure 8:
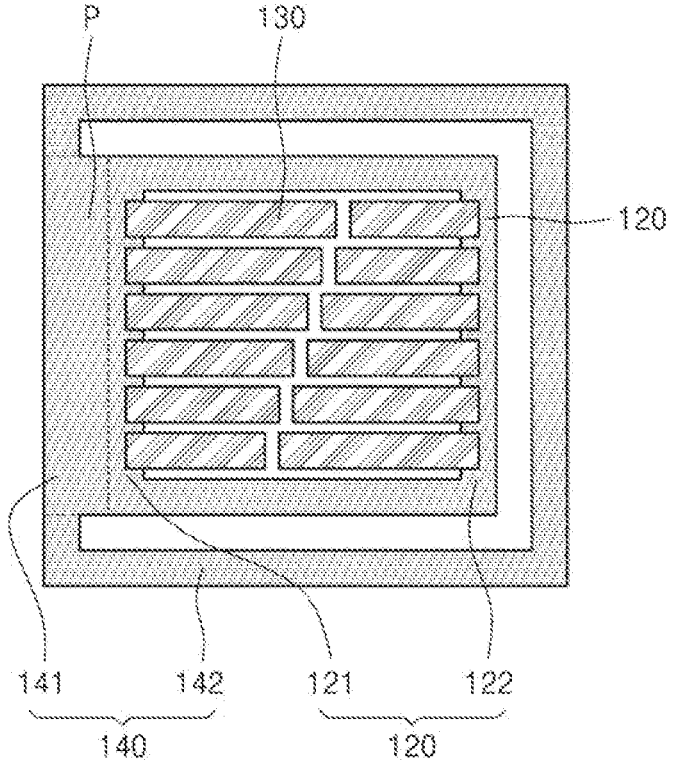
FIG. 8 is a diagram illustrating a MEMS sensor including a second frame having a non-uniform thickness, according to an example embodiment.

FIG. 8 is a diagram illustrating a MEMS sensor including the second frame 140 having a non-uniform thickness, according to an embodiment. Comparing FIGS. 1 and 8, the width of the first region 141 of the second frame 140 of FIG. 8 may be greater than the width of the second region 142 of the second frame 140. For example, the width of the first region 141 of the second frame 140 may be equal to the sum of the width of the second region 142 and the gap between the first frame 120 and the second region 142 of the second frame 140. However, embodiments are not limited thereto. The sum of the width of the second region 142 and the gap between the first frame 120 and the first region 141 is about 1 time or more, about 1.5 times or more, about 2 times or more, or about 3 times or less, or 4 times or less of the width of the first region 141.

An entire lower surface of the second frame 140 may be adhered to the substrate 110. However, embodiments are not limited thereto. For example, a partial region of the second frame 140 may be adhered to the substrate.

Figure 9:
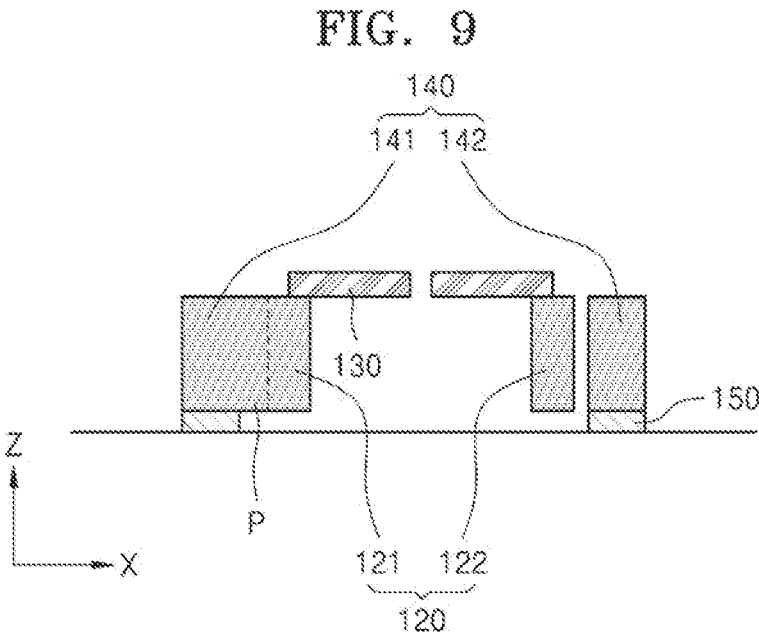
FIG. 9 is a diagram illustrating a state in which only a partial region of a second frame of the MEMS sensor of FIG. 8 is adhered to a substrate.

FIG. 9 is a diagram illustrating a state in which only a partial region of the second frame 140 of the MEMS sensor of FIG. 8 is adhered to a substrate. As shown in FIG. 9, a partial region of the first region 141 of the second frame 140 is adhered to the substrate 110, and the remaining region of the first region 141 is not adhered to the substrate 110. For example, a portion of the lower surface of the first region 141 may be spaced apart from the substrate 110. The remaining region of the first region 141 may be a region P protruded toward the first frame 120 with respect to the second region 142.

Comparing FIGS. 1 and 9, the first frame 120 of FIG. 9 may further be spatially separated from the adhesive layer 150 by the protruded region P. Thus, even if the first frame 120 receives an external force, the first frame 120 may be more easily restored to its original state.

Figure 10:
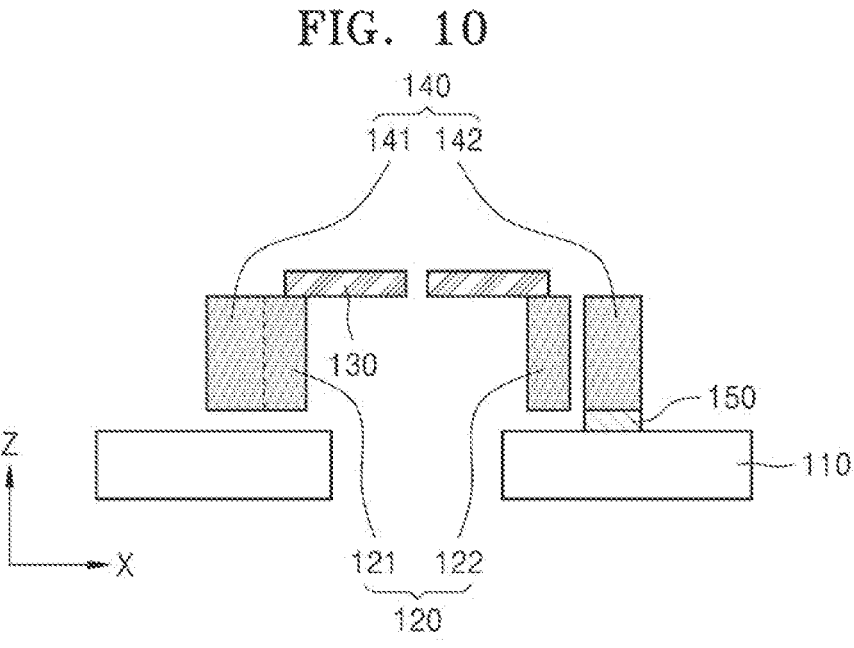
FIG. 10 is a diagram illustrating a state in which only a partial region of a second frame of the MEMS sensor of FIG. 1 is adhered to a substrate.

FIG. 10 is a diagram illustrating a state in which only a partial region of the second frame 140 of the MEMS sensor of FIG. 1 is adhered to the substrate 110. As shown in FIG. 10, the second region 142 of the second frame 140 is adhered to the substrate 110, and the first region 141 of the second frame 140 may not be adhered to and spaced apart from the substrate 110. Even if the first frame 120 receives an external force, the first frame 120 may be more effectively restored to its original state.

In order to test whether the external force affects the first frame 120, a first frame 120 having a rectangular shape with a long side of 3 mm, a short side of 1 mm, a width of 0.1 mm, and a thickness of 0.4 mm with a silicon material was designed, and a plurality of resonators 130 were disposed on the first frame 120.

Figure 11:
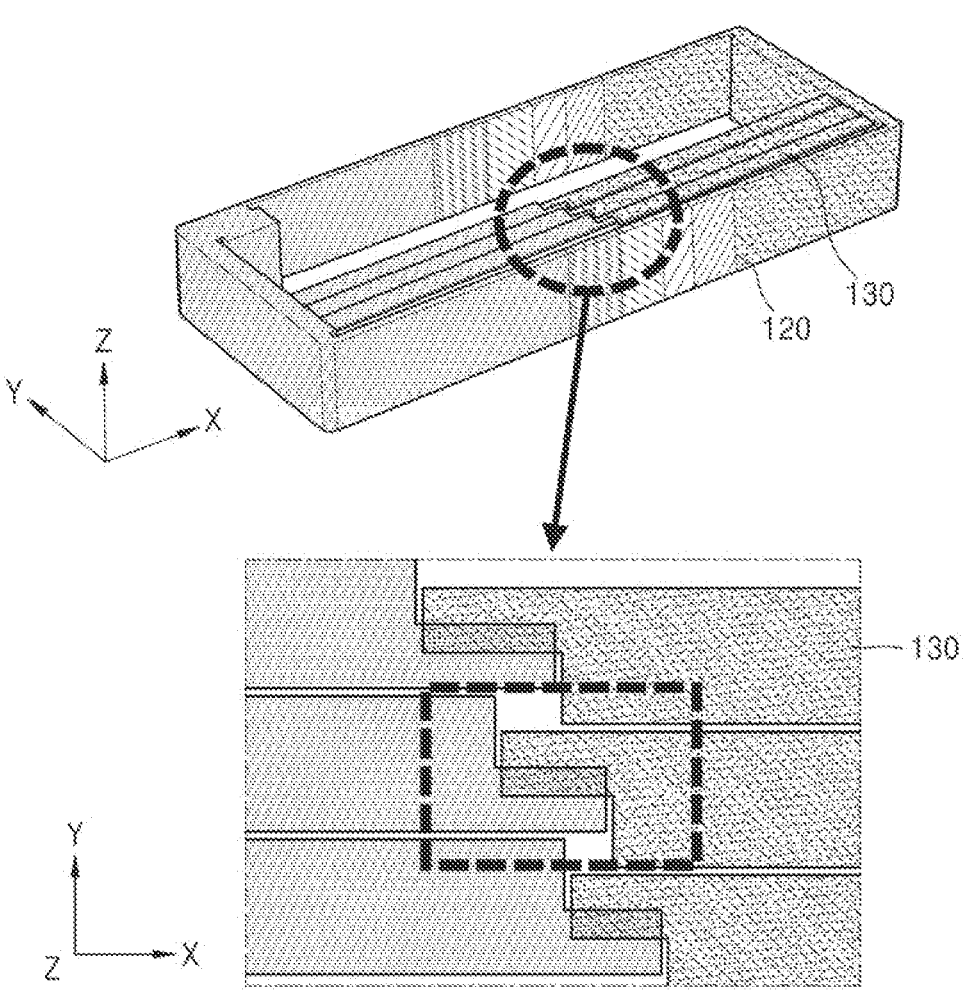
FIG. 11 is a diagram when an external force is applied to a first frame without a second frame as a related example.

FIG. 11 is a diagram when an external force is applied to a first frame 120 without a second frame as a related example. In FIG. 11, a change in contrast or hatching indicates the degree of deformation of the first frame 120 due to an external force. As shown in FIG. 11, deformation in which the resonators 130 facing each other overlap may occur. Thus, when the MEMS sensor operates, the resonators 130 may collide with each other or may be damaged, and electrical signals generated from the resonators 130 may be short-circuited.

A second frame having a rectangular shape with a long side of 3 mm, a short side of 1 mm, a width of 0.1 mm, and a thickness of 0.4 mm is designed using a silicon material, and a first frame in which a gap between the first frame and a second region of a second frame is 0.1 mm is designed inside the second frame. Then, the resonators 130 were disposed in the first frame.

Figure 12:
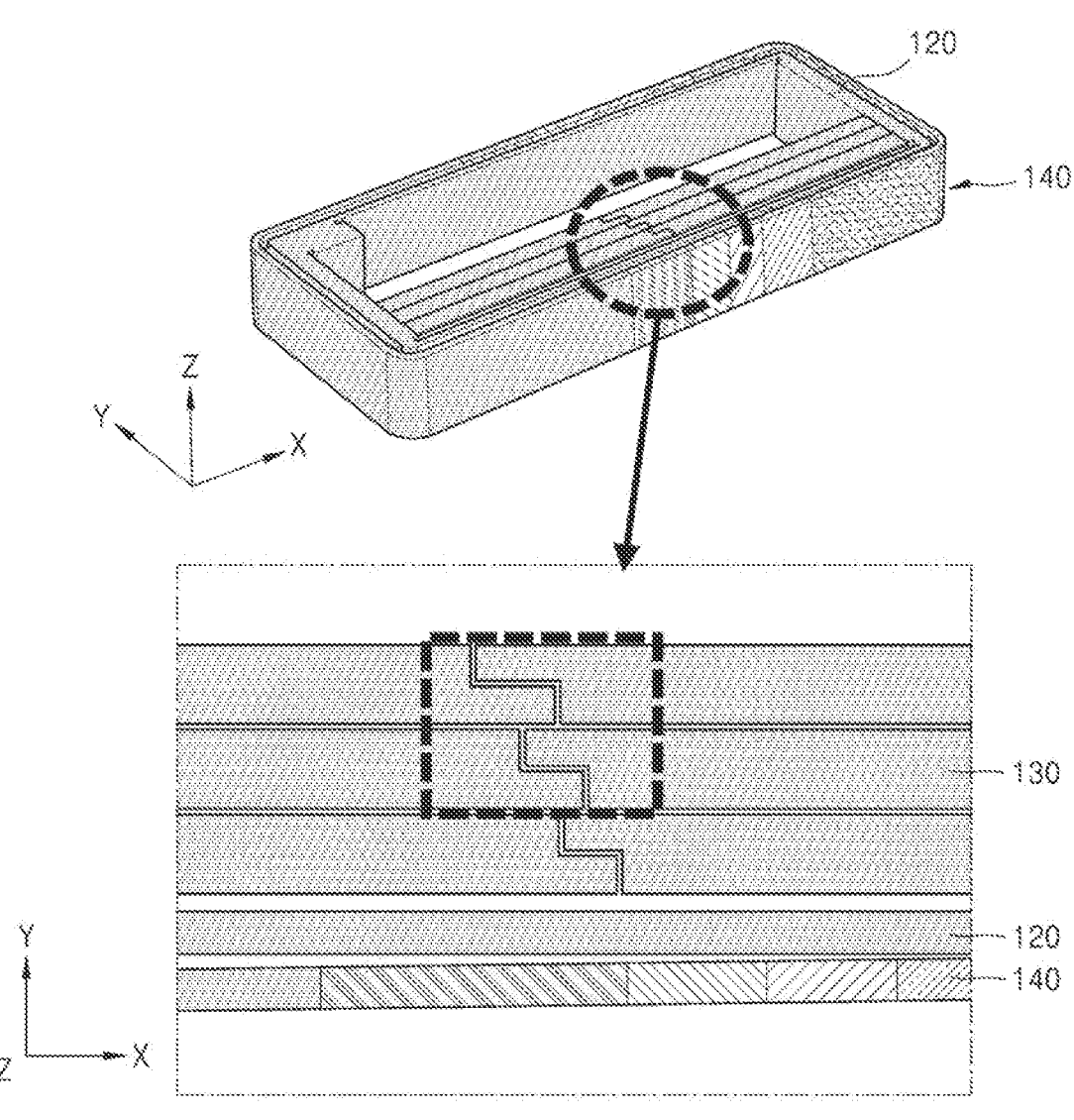
FIG. 12 is a diagram showing application of an external force to a second frame according to an example embodiment.

FIG. 12 is a diagram when an external force is applied to the second frame 140 according to an example embodiment. A change in color or hatching in FIG. 12 indicates the degree of deformation of the second frame 140 due to an external force. Referring to FIG. 12, although deformation occurred in the second frame 140 due to an external force, the first frame 120 is hardly deformed. Thus, it may be confirmed that the resonators 130 attached to the first frame 120 also maintain their original state.

The shape of the outer circumferential surface of the second frame 140 may have various shapes other than a rectangular shape. For example, the outer circumferential surfaces of the first frame 120 and the second frame 140 may be polygonal, such as hexagonal or octagonal, circular, or oval, and may vary according to the use of the MEMS sensor.

Figure 13:
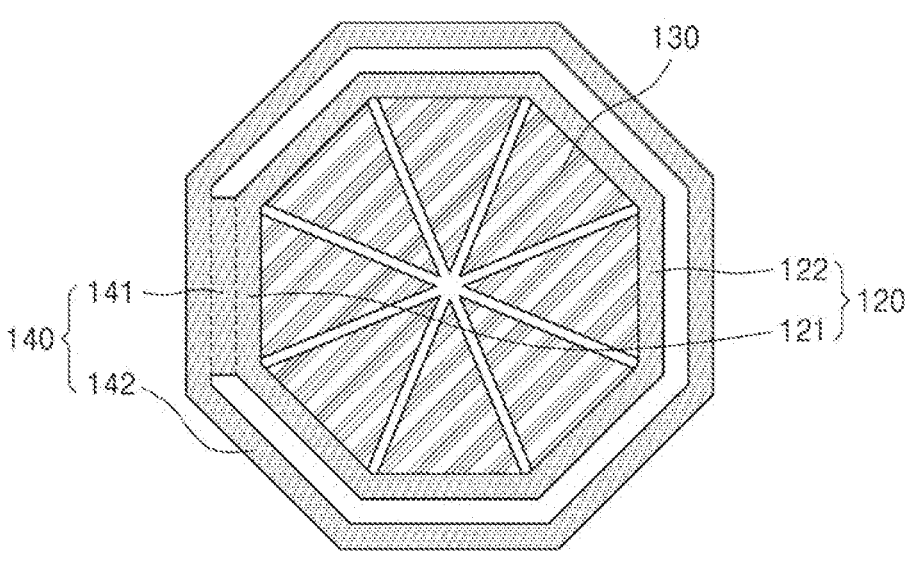
FIG. 13 is a diagram illustrating a MEMS sensor including a second frame, an outer circumferential surface of which has an octagonal shape, according to an example embodiment.
Figure 14:
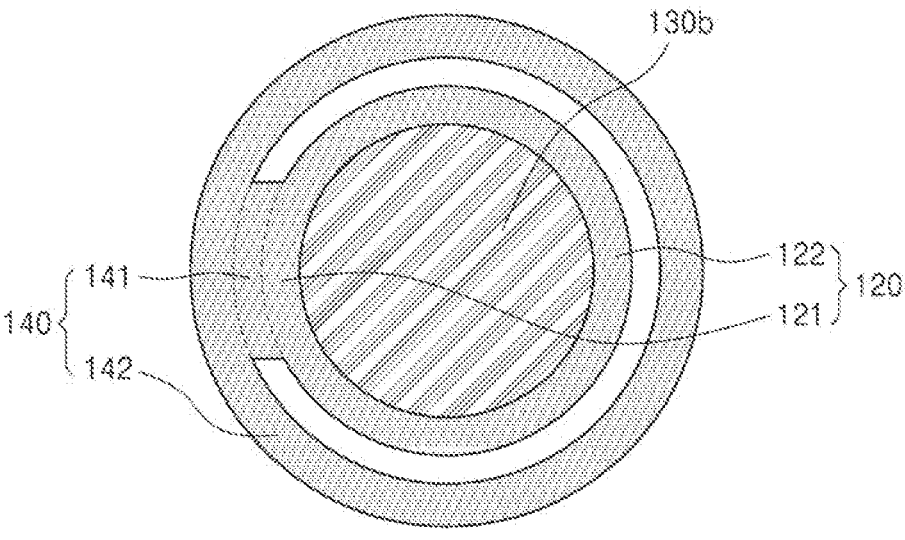
FIG. 14 is a diagram illustrating a MEMS sensor including a second frame, an outer circumferential surface of which has an octagonal shape, according to an example embodiment.

FIG. 13 is a diagram illustrating a MEMS sensor including the second frame 140, an outer circumferential surface and an inner circumferential surface of which have an octagonal shape, according to an example embodiment, and FIG. 14 is a diagram illustrating a MEMS sensor including the second frame 140, an outer circumferential surface and an inner circumferential surface of which have a circular shape, according to an example embodiment. The shape of the outer circumferential surface of the second frame 140 may vary depending on the use of the MEMS sensor, the shape of the resonator 130, and the like. Although the outer circumferential surface of the second frame 140 has various shapes, the first region 141 of the second frame 140 is connected to the first region 121 of the first frame 120 and the second region 142 of the second frame 140 may be spatially separated from the second region 122 of the first frame 120. Although the first frame 120 is connected to the substrate 110 through the first region 141 of the second frame 140, and the second region 142 of the second frame 140 is deformed by an external force, deformation of the first frame 120 may be minimized.

In the example embodiments described above, the shape of the outer circumferential surface and the inner circumferential shape of the second frame 140 have been described as the same. However, embodiments are not limited thereto.

The shape of the outer circumferential surface and the shape of the inner circumferential surface of the second frame 140 may be different from each other.

Figure 15:
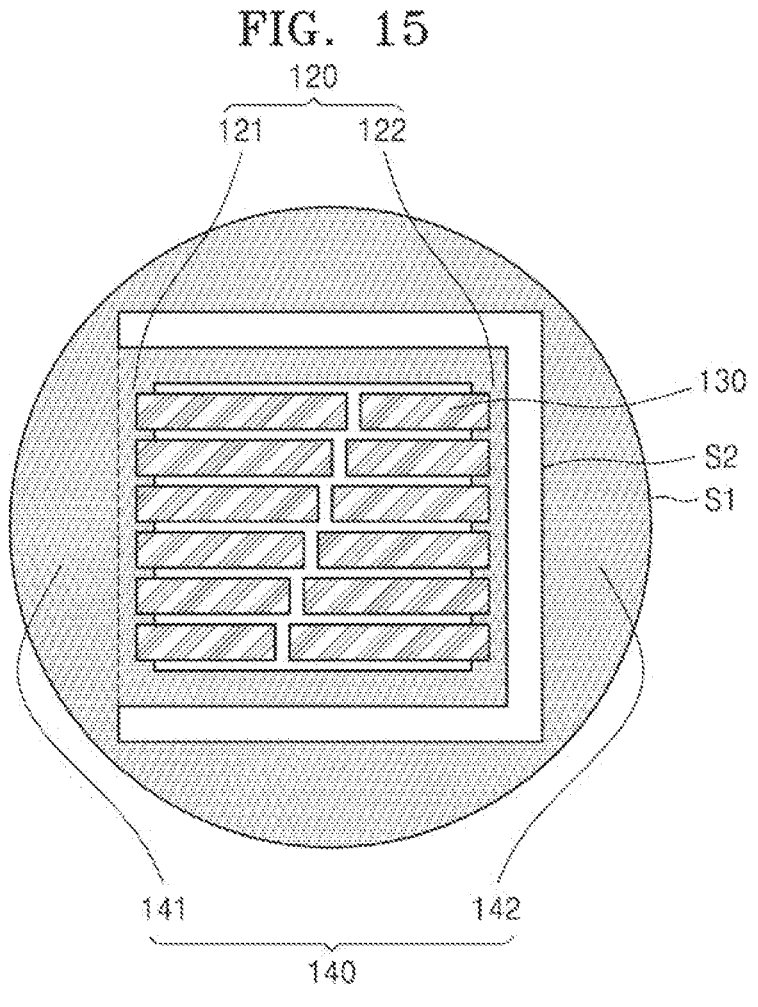
FIG. 15 is a diagram illustrating a MEMS sensor including a second frame having inner and outer circumferential surfaces that have different shapes from each other, according to an example embodiment.

FIG. 15 is a diagram illustrating a MEMS sensor including a second frame 140 having inner and outer circumferential surfaces that have different shapes from each other, according to an example embodiment. As shown in FIG. 15, the outer circumferential surface S1 of the second frame 140 may be a circular shape, and the inner circumferential surface S2 of the second frame 140 may be a rectangular shape. The outer circumferential surface S1 of the second frame 140 may have a polygonal shape of a circle, an ellipse, or a pentagon or more to disperse an external force. The inner circumferential surface S2 of the second frame 140 has a quadrangular shape so that the first frame 120 and the resonator 130 are easily arranged.

It has been described that the second frame 140 covers the entire outer circumferential surface of the first frame 120. When the second frame 140 wraps around the entire outer circumferential surface of the first frame 120, the first frame 120 and the resonator 130 may be more effectively protected from external forces. However, embodiments are not limited thereto.

When the MEMS sensor is disposed at a relatively stable position from an external force in an electronic apparatus or when the first frame 120 includes a material having relatively high elasticity, the first frame 120 may be restored against a temporary external force. Thus, the second frame 140 may perform only a role of fixing the first frame 120 to the substrate 110.

Figure 16:
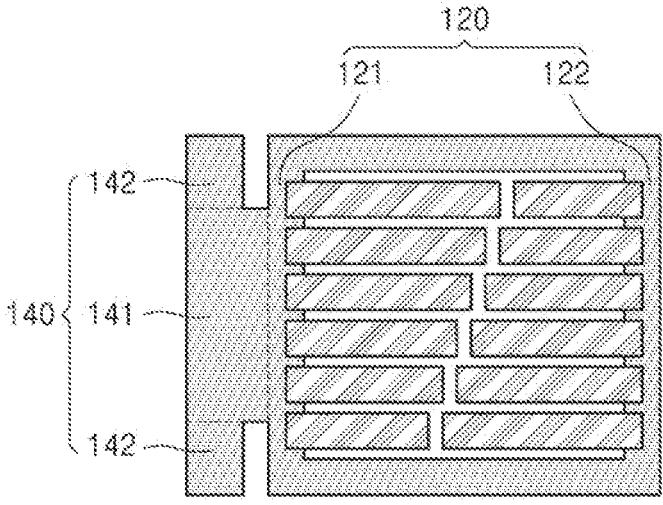
FIG. 16 is a diagram illustrating a MEMS sensor including a bar-shaped second frame according to an example embodiment.

FIG. 16 is a diagram illustrating a MEMS sensor including a bar-shaped second frame according to an example embodiment. As shown in FIG. 16, the MEMS sensor may include a bar-shaped second frame 140 connected to the first region 121 of the first frame 120. The second frame 140 may include a bar-shaped first region 141 connected to the first frame 120 and a bar-shaped second region 142 spatially separated from the second frame 140. The first region 141 of the second frame 140 may not be adhered to the substrate 110, and the second region 142 of the second frame 140 may be adhered to the substrate 110. The first frame 120 may be connected to the substrate 110 through the second frame 140.

Figure 17:
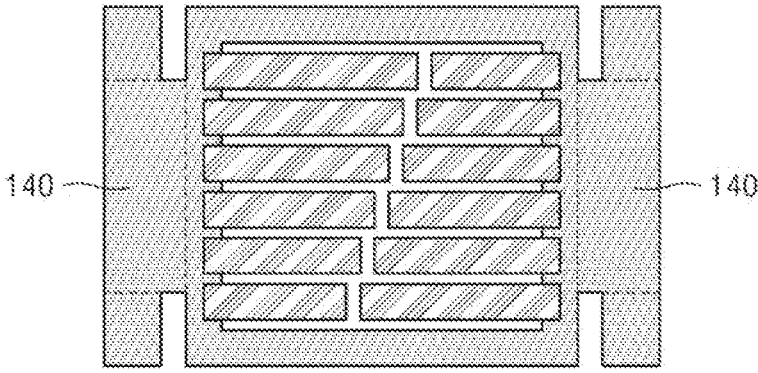
FIG. 17 is a diagram illustrating a MEMS sensor including a plurality of second frames according to an example embodiment.

The second frame 140 may be provided in plural numbers. FIG. 17 is a diagram illustrating a MEMS sensor including a plurality of second frames according to an example embodiment. As shown in FIG. 17, one second frame 140 may be connected to a partial region of the first frame 120, and the other second frame 140 may be connected to another partial region of the first frame 120. Because the first frame 120 is connected to the substrate 110 through the plurality of second frames 140, the first frame 120 may be more stably disposed on the substrate 110.

Figure 18:
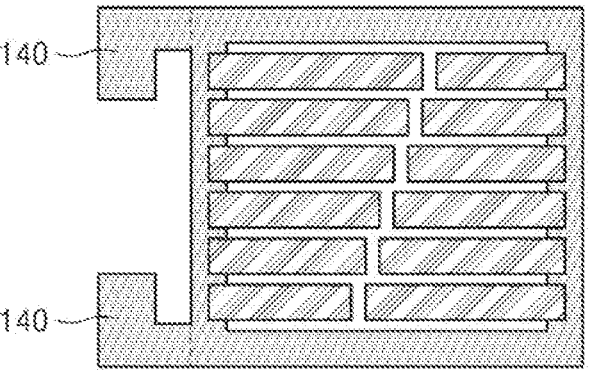
FIG. 18 is a diagram illustrating a MEMS sensor including a plurality of second frames according to another example embodiment.

FIG. 18 is a diagram illustrating a MEMS sensor including a plurality of second frames according to another embodiment. Referring to FIGS. 17 and 18, the plurality of second frames 140 shown in FIG. 17 may be respectively disposed on opposite and separate sides of the first frame 120, while the plurality of second frames 140 shown in FIG. 18 may be respectively disposed on one side of the first frame 120 and spaced apart from each other. The arrangement and shape of the second frame 140 may be variously modified depending on the use of the MEMS sensor.

Figure 19:
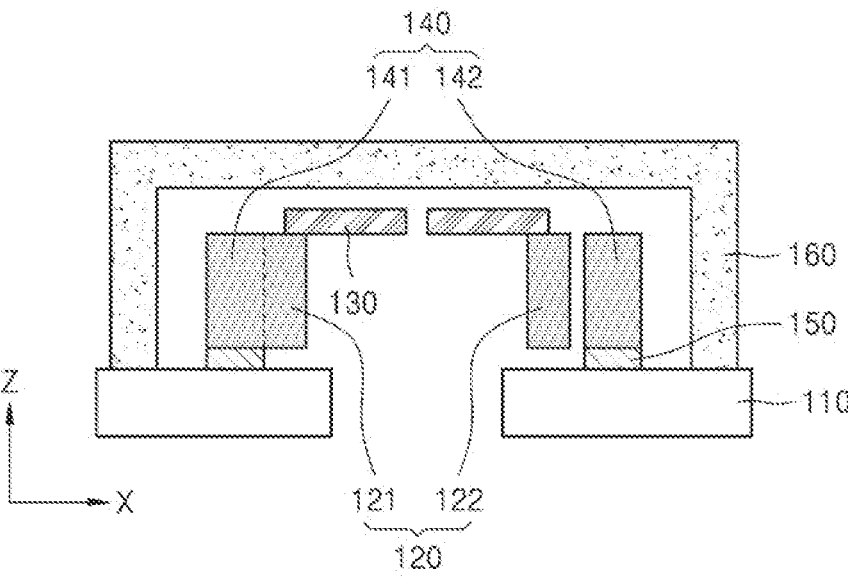
FIG. 19 is a diagram illustrating a MEMS sensor including a cover according to an example embodiment.

FIG. 19 is a diagram illustrating a MEMS sensor including a cover 160 according to an example embodiment. The resonator 130 of the MEMS sensor may resonate by sound, pressure, or the like. In a process of resonating, the resonator

130 may deviate the second cavity C2, and thus, may further include a cover 160 to protect the resonator 130. The cover 160 may have a shape surrounding the first frame 120, the second frame 140, and the resonator 130.

The cover 160 may be manufactured separately from the first and second frames 120 and 140 and adhered to the substrate 110.

Figure 20:
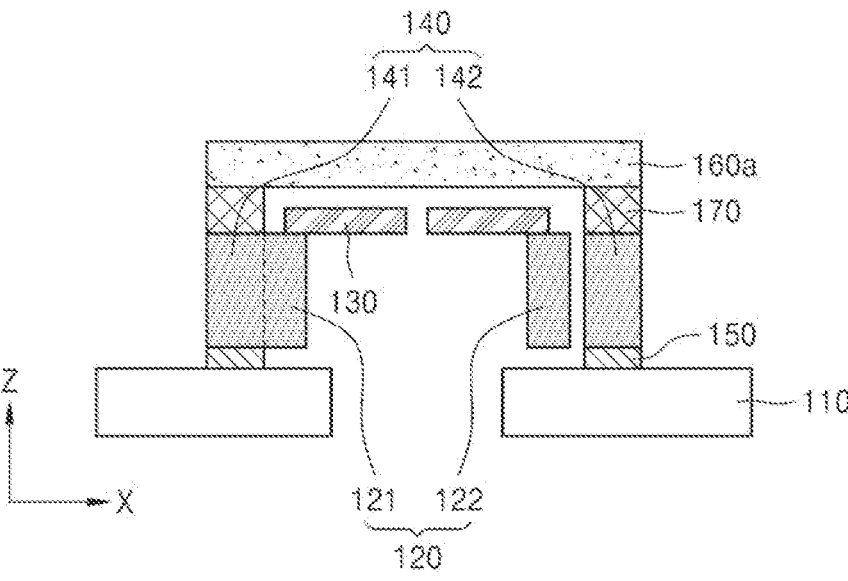
FIG. 20 is a diagram illustrating a MEMS sensor including a cover according to another example embodiment.

The cover 160 according to an example embodiment may be connected to the substrate 110 through the second frame 140. FIG. 20 is a diagram illustrating a MEMS sensor including a cover 160*a* according to another example embodiment. As shown in FIG. 20, the MEMS sensor includes a spacer 170 disposed on the second frame 140 and a cover 160 disposed on the spacer 170 and covering the first frame 120 and the resonators 130. The second frame 140 may support the cover 160 while protecting the first frame 120. When the second frame 140 has a thickness greater than that of the first frame 120, the spacer 170 may not be provided.

The MEMS sensor according to the example embodiment described above may operate as an acoustic sensor, a gyro sensor, and a pressure sensor according to the sensing characteristics of the sensor 230 of the resonator 130, and may be applied to various electronic apparatuses, for example, a smart phone, a foldable phone, an artificial intelligence (AI) speaker, augmented reality (AR) glasses, a wearable device, or an electronic device, such as a robot or a television (TV).

Figure 21:
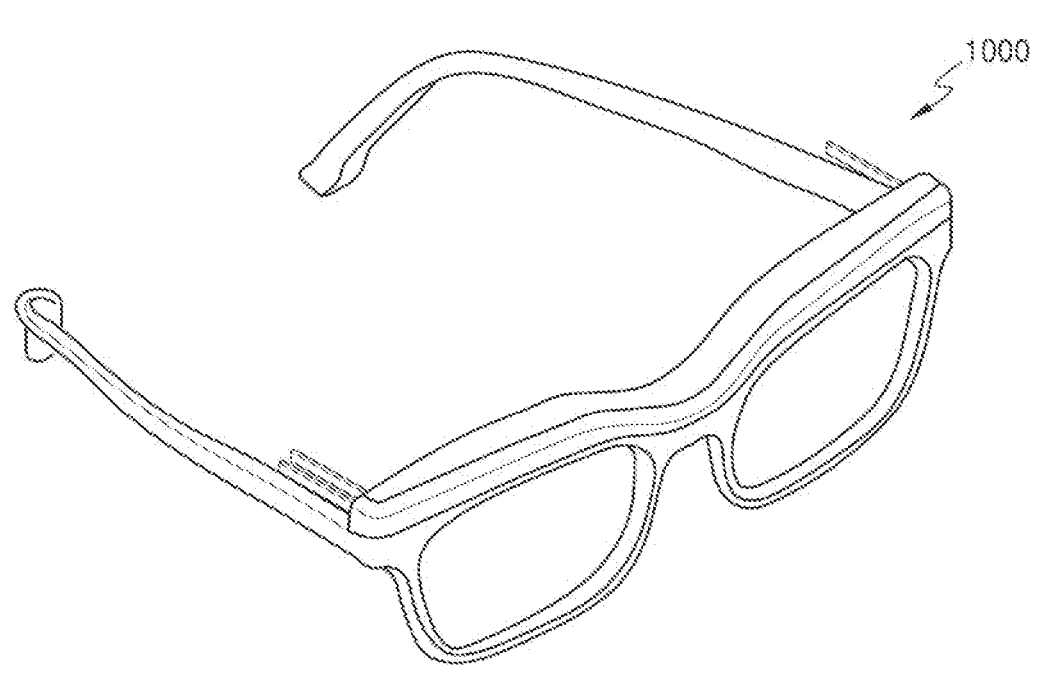
FIGS. 21, 22, 23, 24, 25, and 26 show examples of electronic devices including a MEMS sensor according to an example embodiment.
Figure 22:
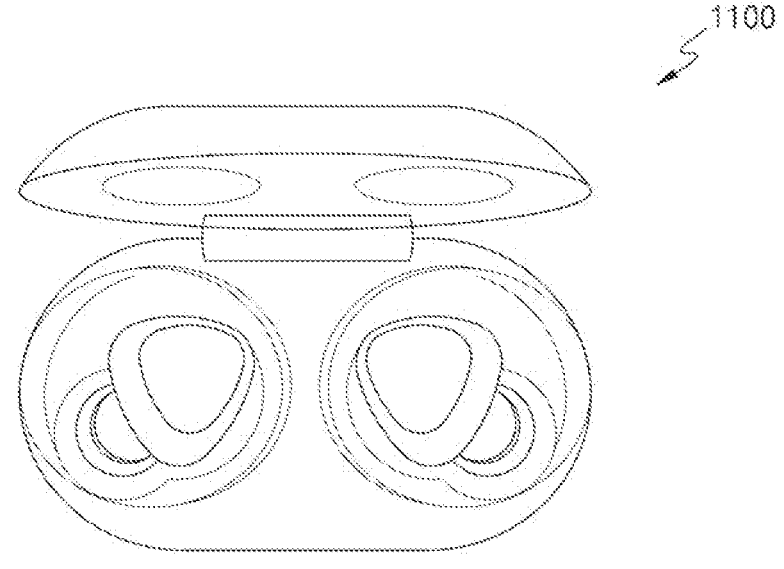
Figure 23:
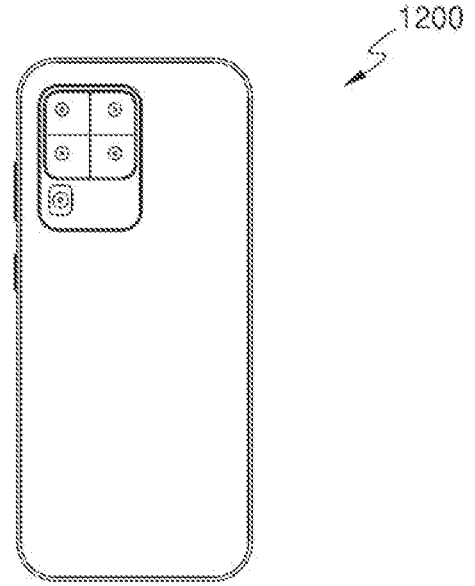
Figure 24:
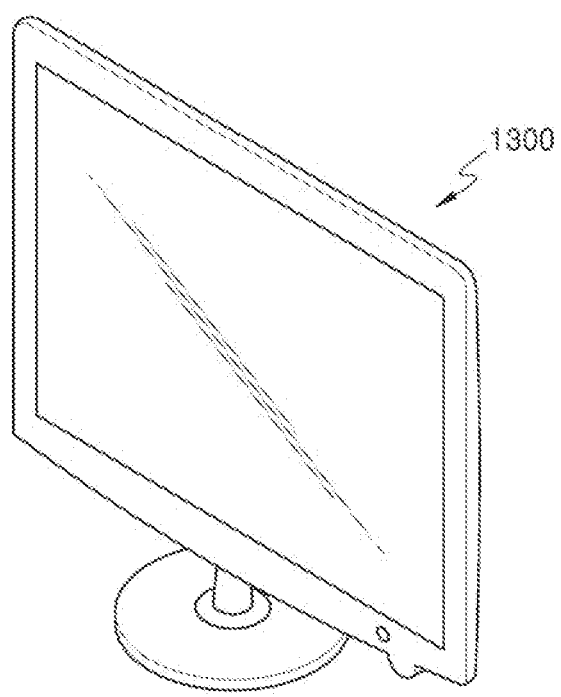
Figure 25:
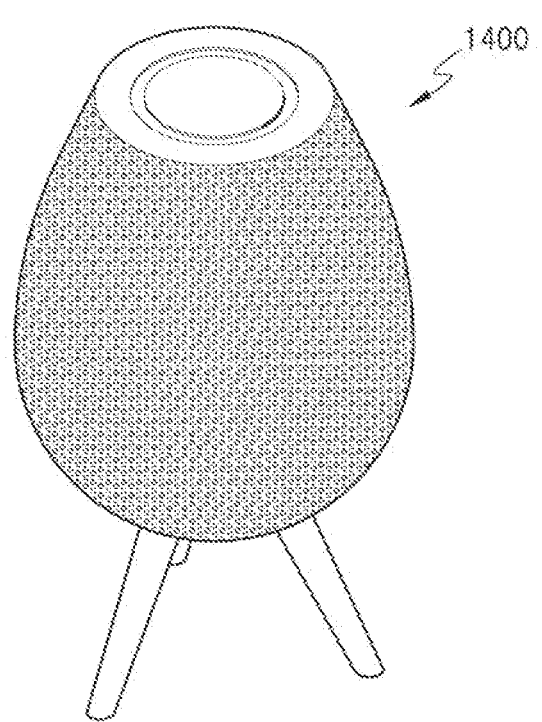
Figure 26:
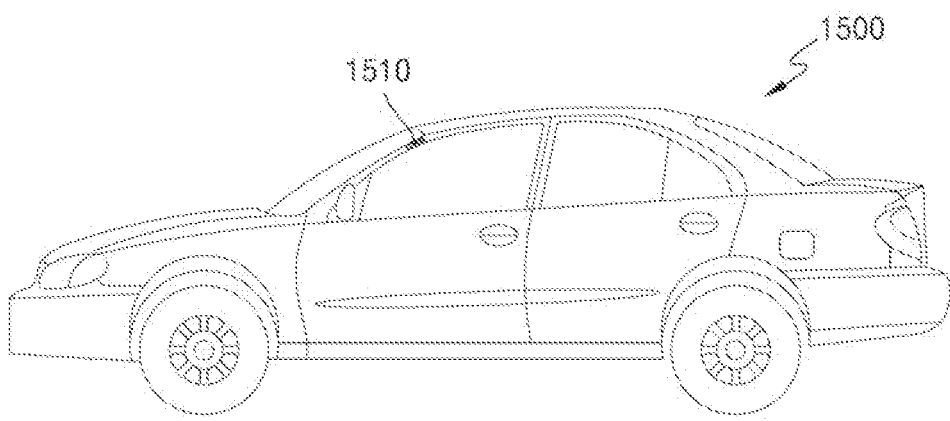

For example, the MEMS sensor according to the example embodiment may be applied as a voice interface device in an AR glasses 1000 illustrated in FIG. 21, earbuds 1100 illustrated in FIG. 22, a smart phone 1200 illustrated in FIG. 23, a TV 1300 illustrated in FIG. 24, and artificial intelligence speaker 1400 illustrated in FIG. 25. In addition, the MEMS sensor according to the example embodiment may be applied to a vehicle 1500 as shown in FIG. 26. FIG. 26 shows an example in which the MEMS sensor according to the example embodiment is provided on an upper side of a windshield, and also, the MEMS sensor according to the example embodiment may be mounted at various positions inside and outside a vehicle 1500. In addition, the MEMS sensor according to the example embodiment may be applied to various electronic devices including household appliances, such as air conditioners, refrigerators, and air purifiers.

In the present disclosure, a frame supporting the resonator and a frame fixed to the substrate are separately provided, thus, defects in the resonator due to deformation of the frame may be reduced. However, the advantages of the present disclosure are not limited thereto.

The foregoing example embodiments are merely illustrative, and thus, it will be understood by those skilled in the art that various changes in form and details may be made therein without departing from the spirit and scope of the present disclosure.

Accordingly, the scope of the present disclosure is defined not by the detailed description but by the appended claims and their equivalents.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. A micro electro-mechanical system (MEMS) sensor comprising:
   a substrate including a first cavity;
   a first frame including a second cavity at least partially overlapping the first cavity in a first direction, at least a portion of the first frame being spaced apart from the substrate;
   a plurality of resonators, each of the plurality of resonators comprising a first end connected to the first frame and a second end extending into the second cavity; and
   a second frame comprising a first region connected to the first frame and a second region spaced apart from the first frame in a second direction perpendicular to the first direction and a third direction perpendicular to the first direction and the second direction, the second frame being connected to the substrate,
   wherein a width of the first region in the third direction is greater than or equal to a width, in the third direction, of a portion of the second region and a width, in the second direction, of a remaining portion of the second region.

2. The MEMS sensor of claim 1, wherein the second frame is provided adjacent to an outer circumferential surface of the first frame.

3. The MEMS sensor of claim 1, wherein the first frame and the second frame have a monolithic structure.

4. The MEMS sensor of claim 1, wherein the first frame and the second frame comprise silicon.

5. The MEMS sensor of claim 1, wherein the first region extends in the second direction and the portion of the second region extends in the second direction and the remaining portion of the second region extends in the third direction, and
   wherein a length, in the second direction, of the first region is less than a length, in the second direction, of the portion of the second region and a length, in the third direction, of the remaining portion of the second region.

6. The MEMS sensor of claim 1, wherein the width, in the third direction, of the first region is equal to a sum of the width, in the third direction, of the second region and a gap between the second region and the first frame in the third direction.

7. The MEMS sensor of claim 1, wherein a gap between the second region of the second frame and the first frame in the third direction is constant.

8. The MEMS sensor of claim 1, wherein, based on the second frame having a rectangular shape, a gap between the second region of the second frame and the first frame is greater than or equal to a value d1 and less than or equal to 4 times of the value d1, where d1 satisfies:

$$d1 = \frac{L_2^2 * L_1^2}{6 * E_{peri} * (L_2^2 * I_{1,x} + L_1^2 * I_{2,x})} S + \frac{L_2^3 * L_1^3}{12 * E_{peri} * (L_2^3 * I_{1,x} + L_1^3 * I_{2,x})} F$$

$$I_{i,x} = \frac{w_i^3 t_{peri}}{12}, i = 1, 2$$

where, F is a force applied to the second frame in the first direction, S is shear stress of the second frame, $L_i$ (where i=1 or 2) is a length of the first direction side of the second frame, $I_i$, x (where i=1 or 2) is a moment of inertia of the second frame, $E_{peri}$ is a strength of the second frame, and $W_i$ (where i=1 or 2) is a width of the second frame.

9. The MEMS sensor of claim 1, wherein a partial region of the second frame is connected to the substrate.

10. The MEMS sensor of claim 9, wherein the second region of the second frame is connected to the substrate.

11. The MEMS sensor of claim 1, wherein the first region of the second frame is a partial region of the first frame.

12. The MEMS sensor of claim 1, wherein a ratio of a length of the second frame to a width of the second frame is greater than or equal to 8 and less than or equal to 200.

13. The MEMS sensor of claim 1, wherein a ratio of a length of the second frame to a thickness of the second frame is 1.2 to 15.

14. The MEMS sensor of claim 1, wherein a thickness of the second frame is greater than a thickness of the first frame.

15. The MEMS sensor of claim 1, wherein a shape of an outer circumferential surface of the second frame is one of a polygon, a circle, and an oval.

16. The MEMS sensor of claim 1, wherein a shape of an inner circumferential surface of the second frame is different from the shape of an outer circumferential surface of the second frame.

17. The MEMS sensor of claim 1, wherein the substrate comprises a printed circuit board configured to receive electrical signals from the plurality of resonators.

18. The MEMS sensor of claim 1, further comprising a cover configured to protect the plurality of resonators from the outside.

19. The MEMS sensor of claim 18, wherein an end of the cover is connected to the substrate.

20. The MEMS sensor of claim 18, further comprising a spacer that comprises a first end in contact with the cover and a second end in contact with the second frame,
   wherein the cover is connected to the second frame through the spacer.

21. The MEMS sensor of claim 1, wherein the plurality of resonators comprise:
   a first group of resonators fixed to a first side of the first frame; and
   a second group of resonators fixed to a second side of the first frame opposite to the first side.

22. A micro electro-mechanical system (MEMS) sensor comprising:
   a substrate including a first cavity;
   a first frame including a second cavity at least partially overlapping the first cavity in a first direction, at least a portion of the first frame being spaced apart from the substrate;
   a plurality of resonators, each of the plurality of resonators comprising a first end connected to the first frame and a second end extending into the second cavity; and
   a second frame provided adjacent to the first frame, the second frame comprising:
      a first region connected to the first frame and partially spaced apart from the substrate; and
      a second region spaced apart from the first frame in a second direction perpendicular to the first direction and a third direction perpendicular to the first direction and the second direction, the second frame being connected to the substrate,
   wherein a width of the first region in the third direction is greater than or equal to a width, in the third direction, of a portion of the second region and a width, in the second direction, of a a remaining portion of the second region.

* * * * *